(12) United States Patent
Min

(10) Patent No.: US 6,476,444 B1
(45) Date of Patent: Nov. 5, 2002

(54) SEMICONDUCTOR DEVICE AND METHOD FOR FABRICATING THE SAME

(75) Inventor: Eung Whan Min, Kyonggi-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/527,263

(22) Filed: Mar. 17, 2000

(30) Foreign Application Priority Data

Mar. 18, 1999 (KR) .............................................. 99-9232

(51) Int. Cl.$^7$ ................................................ H01L 29/72
(52) U.S. Cl. ........................ 257/330; 257/331; 257/332; 257/401
(58) Field of Search ................................ 257/330, 331, 257/332, 401

(56) References Cited

U.S. PATENT DOCUMENTS

| | | | | |
|---|---|---|---|---|
| 4,954,854 A | * | 9/1990 | Dhong et al. ............... | 257/332 |
| 5,142,610 A | * | 8/1992 | Iwamatsu .................... | 257/332 |
| 5,338,958 A | * | 8/1994 | Mitsumoto .................. | 257/332 |
| 5,801,082 A | | 9/1998 | Tseng | |
| 6,075,269 A | * | 6/2000 | Terasawa et al. ........... | 257/330 |

* cited by examiner

Primary Examiner—Edward Wojciechowicz
(74) Attorney, Agent, or Firm—Birch, Stewart, Kolasch & Birch, LLP

(57) ABSTRACT

Semiconductor device and method for fabricating the same, in which a gate electrode is formed buried in a surface of a substrate, for improving device performance. The device includes device isolation layers each buried in a device isolation region of a semiconductor substrate for defining active regions, first gate trenches each with a generally square section formed in a surface of the active region, and second gate trenches each with an elliptical section formed in continuation from the first gate trench. A gate oxide film is formed on surfaces of the first and second gate trenches. Gate electrodes are formed in the first and second trenches having the gate oxide film formed thereon, and source/drain regions are formed in surfaces of the semiconductor substrate on both sides of the gate electrodes insulated from the gate electrodes by the gate oxide film.

21 Claims, 6 Drawing Sheets

SEMICONDUCTOR DEVICE AND METHOD FOR FABRICATING THE SAME

BACKGROUND OF THE INVENTION

1. Field of the Invention

The present invention relates to a semiconductor device, and more particularly, to a semiconductor device and a method for fabricating such a semiconductor apparatus in which a gate electrode is formed buried in a surface of a substrate.

2. Description of Related Art

A related semiconductor device and a method for fabricating the same will be explained with reference to the attached drawings. FIGS. 1a~1h illustrate sections showing the steps of a related art method for fabricating a semiconductor device.

Referring to FIG. 1a, the related art method for fabricating a semiconductor device starts with forming a pad oxide film 2 and a nitride layer 3 on a semiconductor substrate 1 in succession. A photoresist 4 is coated on the nitride layer 3. Then, as shown in FIG. 1b, the photoresist layer 4 formed on the nitride layer 3 is selectively patterned to leave a photoresist layer pattern 4a only on an active region. As shown in FIG. 1c, the photoresist layer pattern 4a is used as a mask to selectively etch the exposed nitride layer 3 and the pad oxide film 2. Then, the photoresist layer pattern 4a is removed, and the thusly patterned nitride layer 3a and the pad oxide film 2a are used as masks in etching a device isolation region in the semiconductor substrate 1, to form trenches 5 (see FIG. 1c). As shown in FIG. 1d, an insulating material layer 6 is formed on an entire surface of etched semiconductor substrate 1, including the trenches 5. As shown in FIG. 1e, the insulating material layer 6 is subjected to CMP (Chemical Mechanical Polishing) up to top of the trenches 5, to form device isolation layers 7. The tops of device isolation layers 7 are at the same height as the top surface of the semiconductor substrate 1. As shown in FIG. 1f, a gate oxide film 8 is formed over the surface of the etched semiconductor substrate 1 including the device isolation layers 7, and a gate material, i.e., polysilicon layer 9, is deposited on gate oxide film 8. A refractory metal layer, such as a tungsten layer, is deposited on the polysilicon layer 9 and is subjected to a silicidation process, to form a tungsten silicide layer 10. An HLD (High Temperature Low Pressure Deposition) layer 11, and a nitride cap layer 12 are deposited in succession on the tungsten silicide layer 10. As shown in FIG. 1g, the layers stacked on the gate oxide film 8 are selectively etched to form gate electrodes 13. Impurities are lightly implanted adjacent to electrodes 13 to form source/drain regions 15. As shown in FIG. 1h, a sidewall material layer, such as a nitride film, is deposited over an entire surface of the structure and is etched back to leave a gate sidewall 14 on sides of each of the gate electrodes 13. The gate electrodes 13 (including the gate sidewalls 14) are used as masks when heavily injecting impurities to further form source/drain regions 15 as shown in FIG. 14. However, because the related art semiconductor device fabricated by the aforementioned process has a planar channel region formed beneath the gate, problems such as short channel effect and punch through caused by line width reduction as the devices are densely packed occur.

Thus, the related art semiconductor device has the following problems.

The reduction of a gate line width makes the channel region susceptible to short channel effect and punch through which deteriorates device performance. The miniaturization of devices, including reduction of the gate line width, reduces a contact allowance in a subsequent bit line contact process, which makes both the fabrication process and assurance of reproducibility difficult.

SUMMARY OF THE INVENTION

Accordingly, the present invention is directed to a semiconductor device and a method for fabricating the same that substantially obviates one or more of the above-discussed problems due to limitations and disadvantages of the related art.

Additional features and advantages of the invention are set forth in the description which follows, and in part will be apparent from the description, or may be learned by practice of the invention. The objectives and other advantages of the invention will be realized and attained by, for example, the structure particularly pointed out in the written description and claims hereof as well as the appended drawings.

To achieve these and other advantages and in accordance with the purpose of the present invention, as embodied and described herein, a semiconductor device according to the present invention includes device isolation layers buried in a device isolation region of a semiconductor substrate for defining an active region, first gate trenches each with a generally square section formed in a surface of the active region, and second gate trenches each with an elliptical section formed in continuation with the first gate trenches. A gate oxide film is formed on surfaces of the first and second gate trenches, and gate electrodes are buried in the first and second trenches having the gate oxide film formed thereon. Source/drain regions are formed in surfaces of the semiconductor substrate on both sides of the gate electrodes insulated from the gate electrodes by the gate oxide film.

In another aspect of the present invention, a method for fabricating a semiconductor device according to the present invention includes (1) forming device isolation layers in device isolation regions of a semiconductor substrate, to define an active region, (2) forming a buffer oxide film and a nitride layer over the semiconductor substrate having the device isolation layers formed therein, and selectively etching these layers to expose portions of the semiconductor substrate, (3) using the patterned nitride layer as a mask to etch the exposed semiconductor substrate to form first gate trenches, (4) forming first gate trench sidewalls on sides of the first gate trenches, and further etching the exposed semiconductor substrate, to form second gate trenches as continuations of the first gate trenches, (5) forming a gate oxide film on surfaces of the first and second gate trenches and depositing and planarizing a gate material layer to fill the first and second gate trenches completely, thereby forming gate electrodes, and (6) forming an insulating layer on an entire surface, forming lightly doped impurity regions in surfaces of the semiconductor substrate on both sides of the gate electrodes to a first depth, and forming heavily doped impurity regions by heavily injecting impurities again to a second depth.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1A:
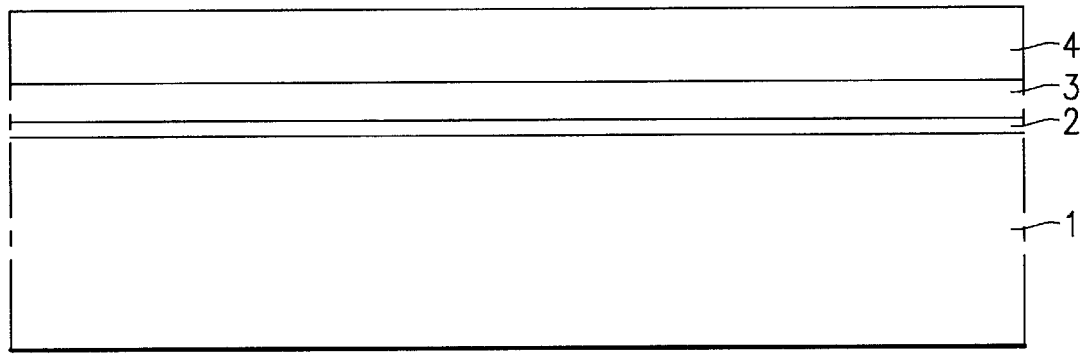
FIGS. 1a~1h are views illustrating a related art method for fabricating a semiconductor device; and, FIGS. 2a~2i are views illustrating a method for fabricating a semiconductor device in accordance with a preferred embodiment of the present invention.
Figure 1B:
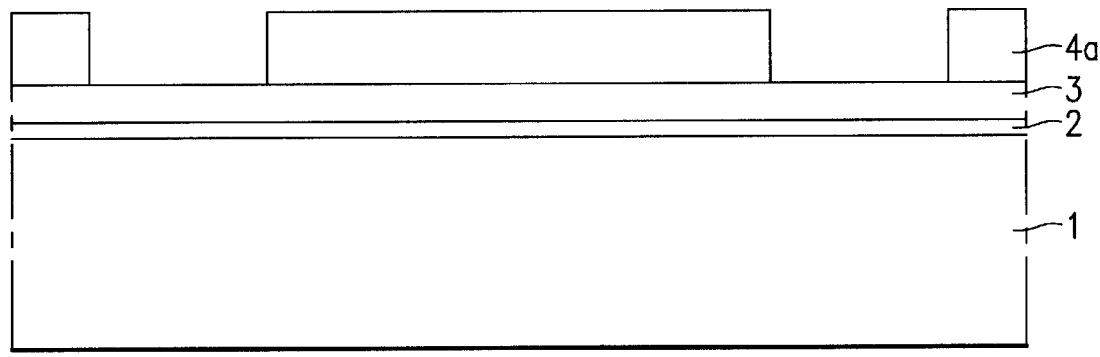
Figure 1C:
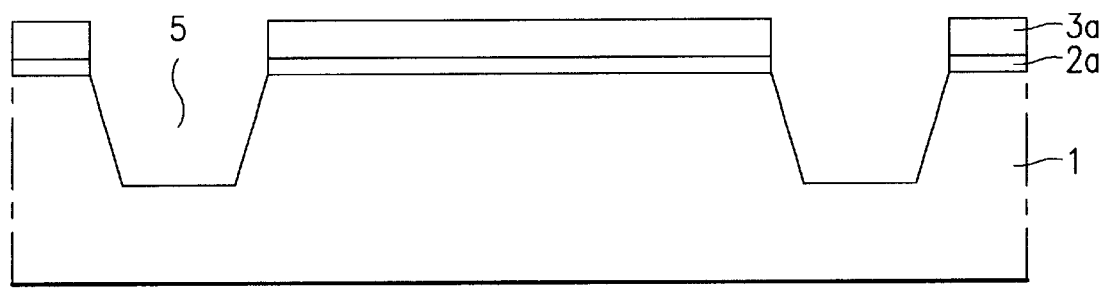
Figure 1D:
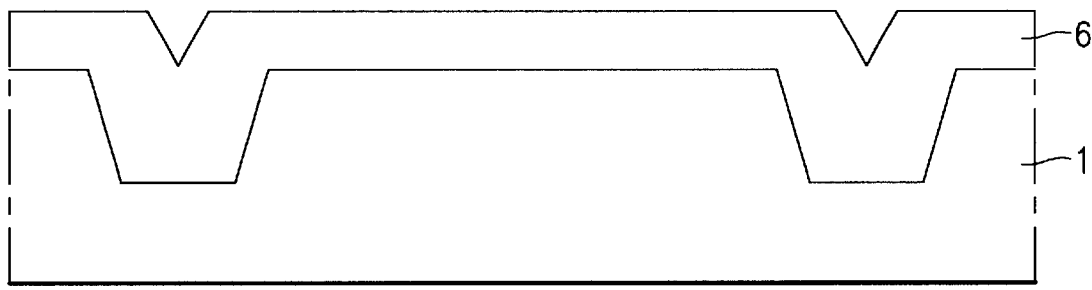
Figure 1E:
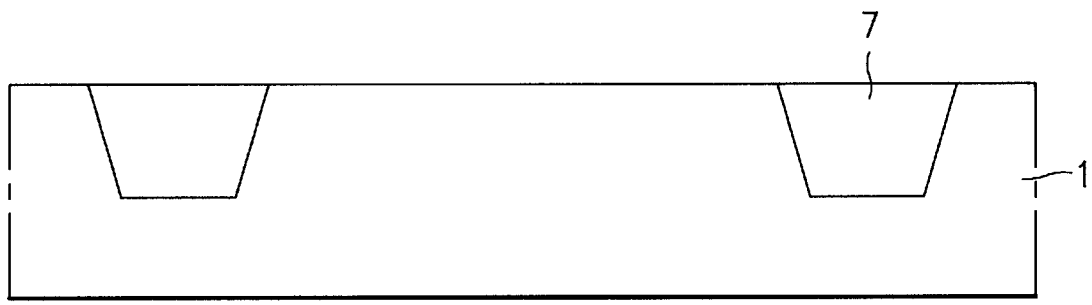
Figure 1F:
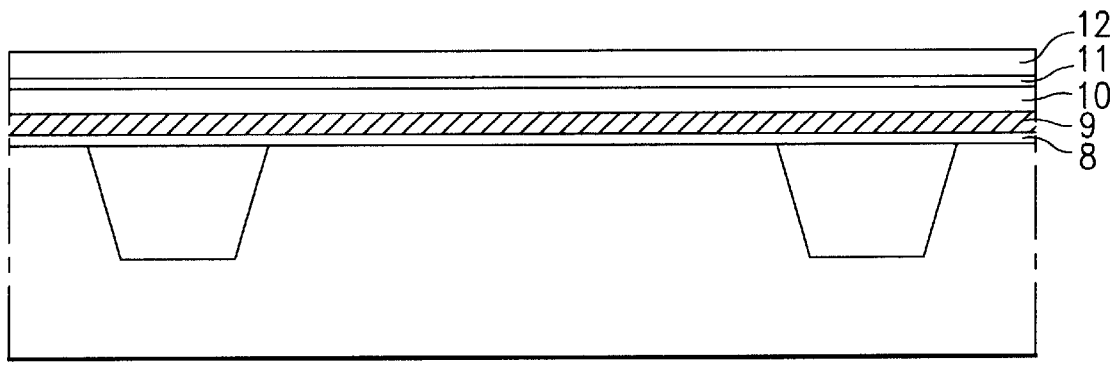
Figure 1G:
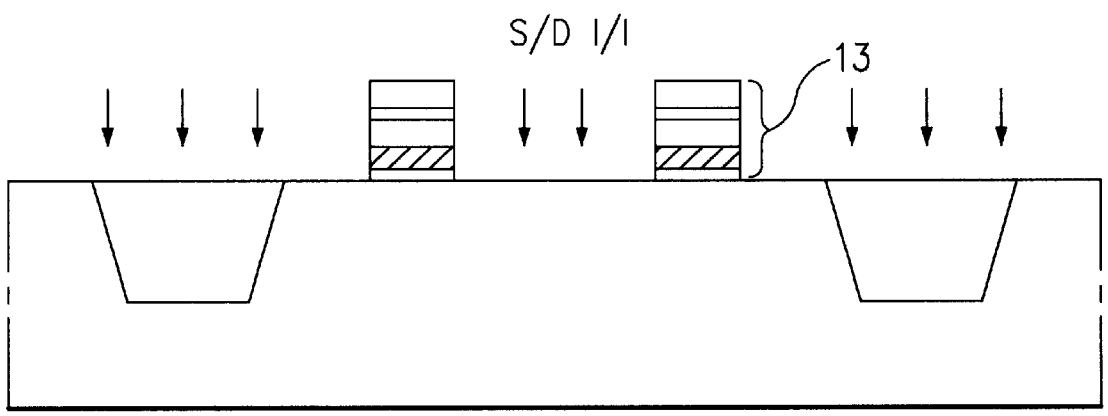
Figure 1H:
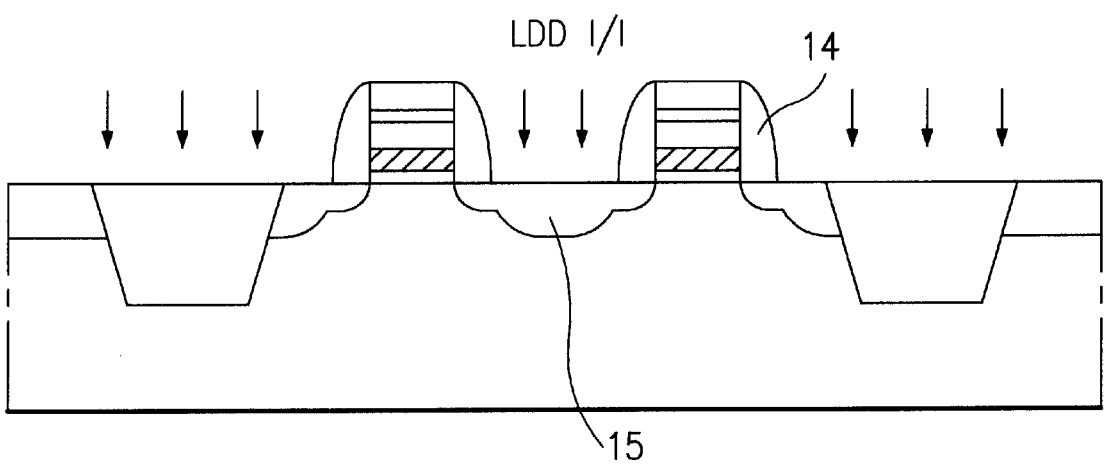

Reference will now be made in detail to the preferred embodiments of the present invention, examples of which are illustrated in the accompanying drawings. FIGS. 2a~2i illustrate a method for fabricating a semiconductor device in accordance with a preferred embodiment of the present invention.

The semiconductor device and a method for fabricating such a semiconductor device according to the present invention can provide a larger channel region by forming device isolation layers by STI (Shallow Trench Isolation), forming trenches in an active region by wet etching, filling the trenches, and forming gate electrodes.

The semiconductor device in accordance with a preferred embodiment of the present invention includes a semiconductor substrate 21. Device isolation layers 27 are formed in a device isolation region in the semiconductor substrate 21 for defining an active region. A first gate trench 30 with a generally square section is formed in the active region. A second gate trench 32 with a generally elliptical section is formed in contact with the first gate trench 30. A gate oxide film 33 is formed on surfaces of the first and second gate trenches 30 and 32. Gate electrodes 34 are formed in the first and second gate trenches 30 and 32 having the gate oxide film 33 formed thereon. Source/drain regions 36 and 37 are formed in surfaces of the semiconductor substrate 21 on both sides of the gate electrode 34 and are insulated from the gate electrodes 34 by the gate oxide film 33. The source/drain regions 36 and 37 overlap the underlying gate electrodes 34. The first gate trench 30 is formed downward from a surface of the semiconductor substrate 21, and the second gate trench 32 is formed beneath the first gate trench 30, and deeper than the first gate trench in continuation therefrom. The second gate trench 32 has an area larger than the first gate trench 30, which effectively provides a larger device channel region.

The method for fabricating a semiconductor device in accordance with a preferred embodiment of the present invention will be explained, with reference to FIGS. 2a~2i.

Figure 2A:
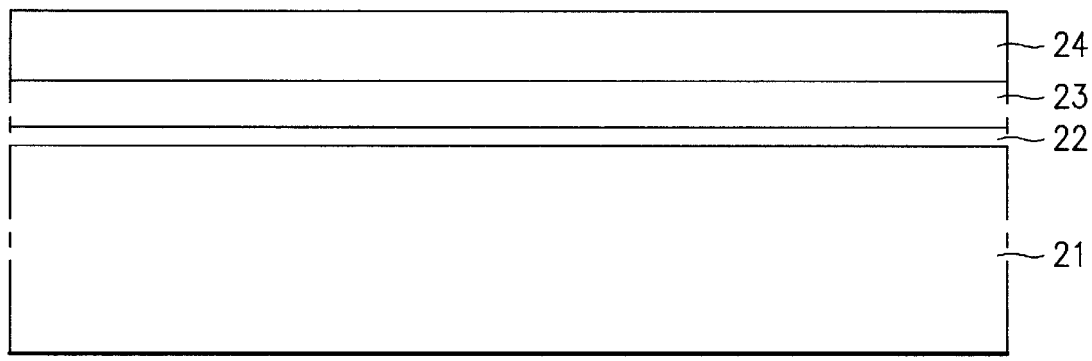
Figure 2B:
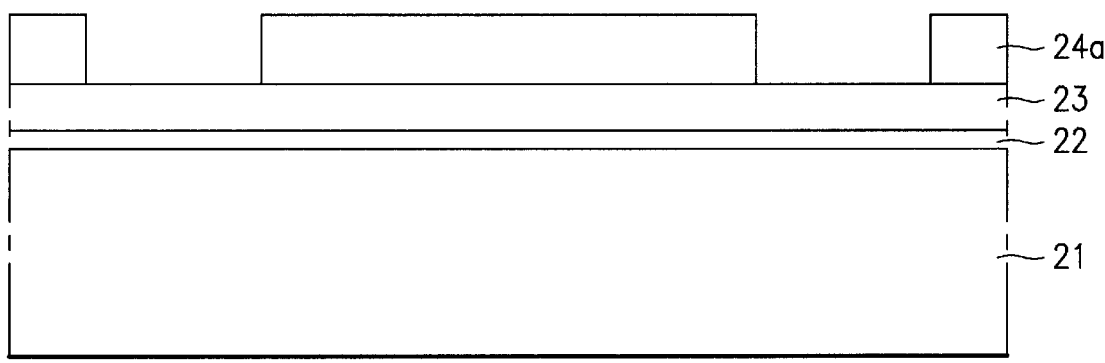
Figure 2C:
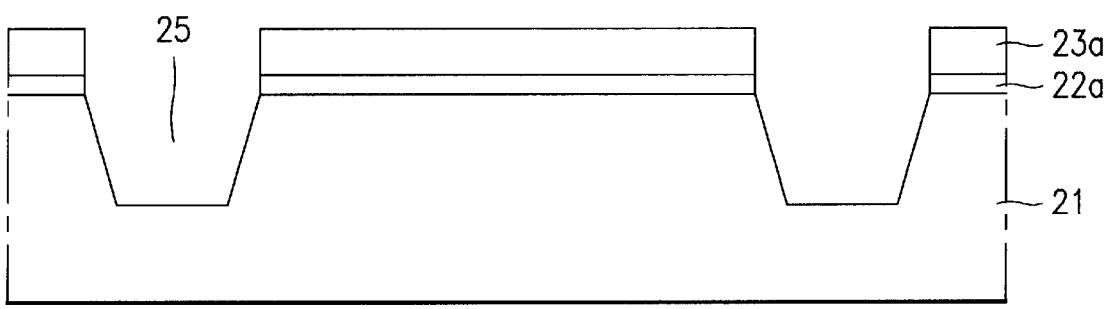
Figure 2D:
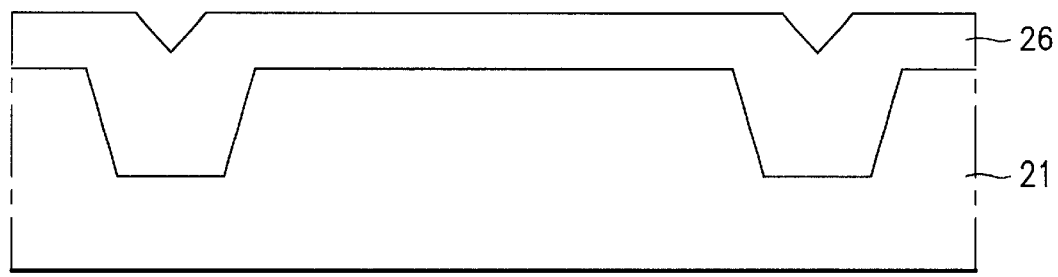
Figure 2E:
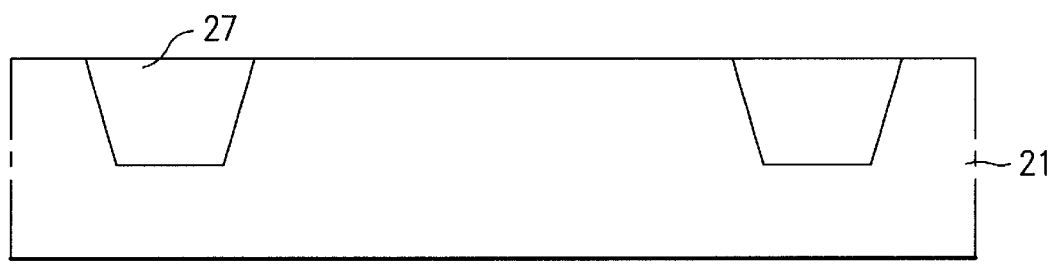
Figure 2F:
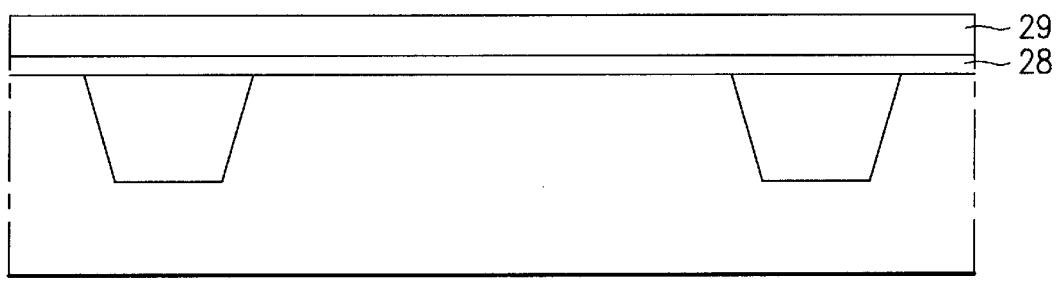
Figure 2G:
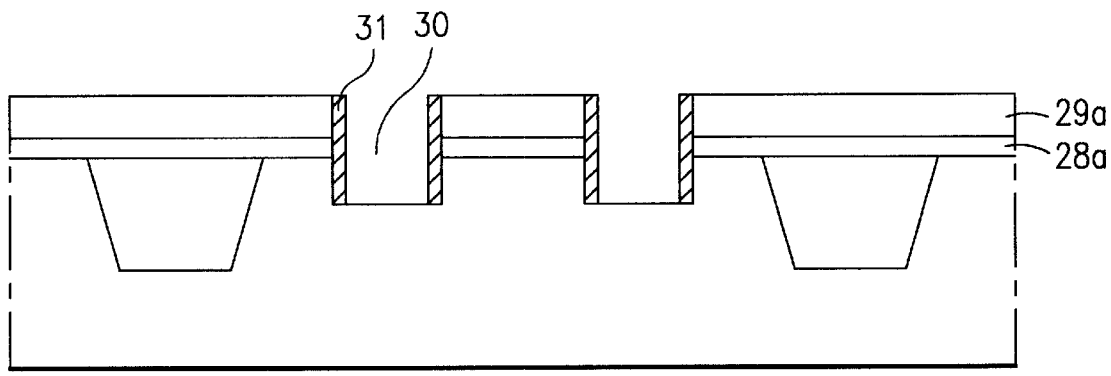

Referring to FIG. 2a, a pad oxide film 22 and a nitride layer 23 are formed on a semiconductor substrate 21 in succession. Photoresist 24 is coated on the nitride layer 23. As shown in FIG. 2b, the photoresist 24 on the nitride layer 23 is selectively patterned, to leave a patterned photoresist layer 24a masking an active region. As shown in FIG. 2c, the patterned photoresist layer 24a is used as a mask in selectively etching the exposed nitride layer 23 and pad oxide film 22. Then, the patterned photoresist layer 24a is removed, and the thusly patterned nitride layer 23a and the patterned pad oxide film 22a are used as masks in etching the exposed device isolation regions of the semiconductor substrate 21, to form trenches 25. As shown in FIG. 2d, an insulating material layer 26 is formed on an etched semiconductor substrate 21 including the trenches 25. As shown in FIG. 2e, the insulating material layer 26 is polished by, for example, CMP (Chemical Mechanical Polishing) down to a top surface of the trenches 25, to form device isolation layer 27 in the etched semiconductor substrate 21 with a height the same with a top surface of the semiconductor substrate 21. As shown in FIG. 2f, a buffer oxide film 28 is formed on the semiconductor substrate 21 having the device isolation layer 27 formed therein. A second nitride layer 29 is formed on the buffer oxide film 28. As shown in FIG. 2g, a first gate electrode ("FG") mask (not shown) is used without fabricating an additional mask to selectively remove portions of the second nitride layer 29 and the buffer oxide film 28. The patterned second nitride layer 29a is used as a mask in etching the exposed semiconductor substrate 21 to form at least one first trench 30. For example, a dry etching process is used to form first trenches 30. First gate trench sidewalls 31 are formed on sides of the first gate trenches 30. The sidewalls 31 are formed of an oxide. The first gate trench sidewalls 31 are formed by, for example, forming an oxide film (using, for example, chemical vapor deposition) over the structure illustrated in FIG. 2g and etching back the oxide film to form first gate trench sidewalls 31, as shown.

Figure 2H:
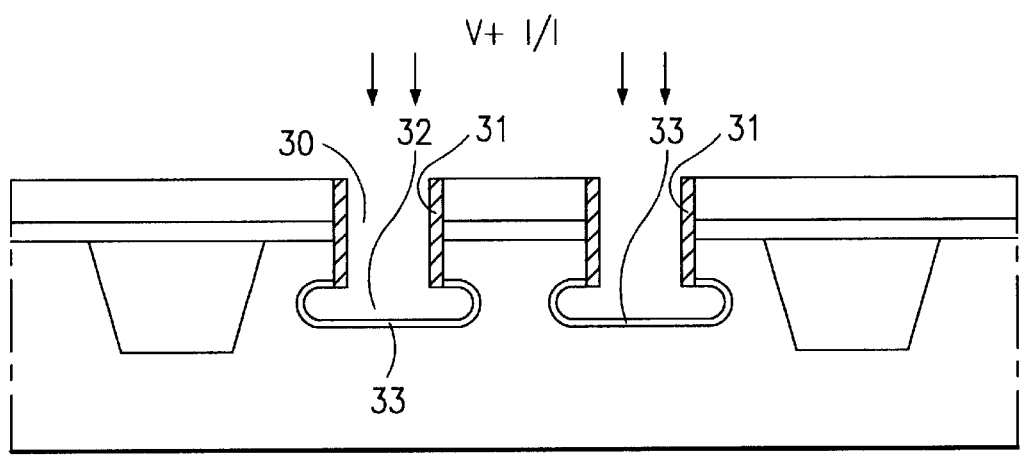

As shown in FIG. 2h, the exposed semiconductor substrate 21 at the bottoms of first gate trenches 30 is additionally, for example, wet etched, to form elliptical second gate trenches 32 at the bottom of respective first gate trenches 30. Exposed surfaces of the second gate trenches 32 are subjected to thermal oxidation, to form an oxide film over the surface of second gate trenches 32.

Collectively, the oxide film formed over the sidewalls of first gate trenches 30 and the oxide film formed over the surface of second gate trenches 32 define gate oxide film 33.

Figure 2I:
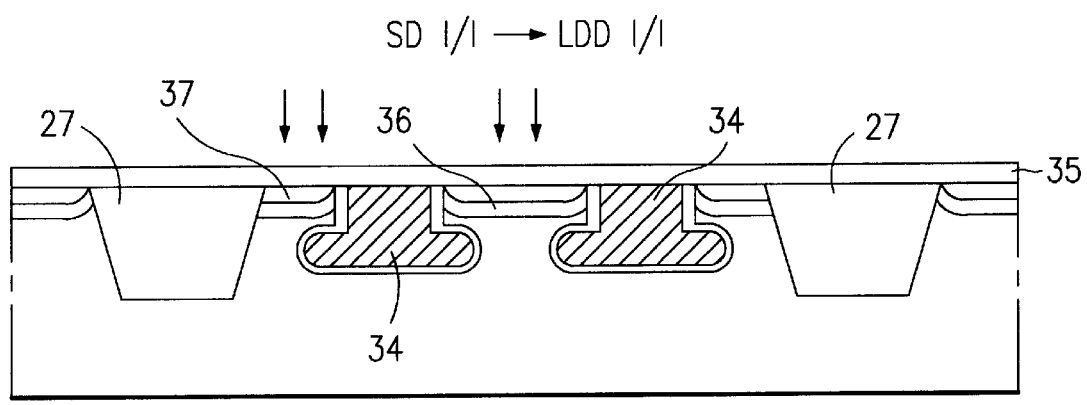

After forming the gate oxide films 33, ion implantation is performed for adjusting a device threshold voltage. As shown in FIG. 2i, a gate material, such as a polysilicon, is deposited by, for example, CVD (Chemical Vapor Deposition) in first and second gate trenches 30 and 32. The gate material is then planarized to form gate electrodes 34. An insulating layer 35 is formed over the resultant structure, a lightly doped impurity region 36 is formed in a surface of the semiconductor substrate 21 to a first depth, a heavily doped impurity regions 37 are formed to a second depth by heavily injecting impurities. The lightly doped and heavily doped impurity regions 36 and 37 are source and drain regions, respectively, and the first depth is deeper than the second depth. Thus, the semiconductor device and method for fabricating the same can effectively provide a larger channel region by burying gate electrodes 34 in the semiconductor substrate 21.

The semiconductor device and method for fabricating the same of the present invention has advantages over the above-described related art, including the following advantages.

The gate electrodes including an elliptical cross-sectional portion formed in the semiconductor substrate to permit adequate device channel regions, which prevents a reduction of the channel regions coming from high density device packing to suppress short channel effect and punch through, thereby improving device performances.

In addition, the buried gate electrodes are favorable in view of step coverage, which facilitates subsequent processing, and allows omission of a separate planarized layer forming process, which simplifies the fabrication process. Overlapping the gate electrodes with the source/drain regions allows a greater contact allowance in a bit line contact process, which facilitates an easily reproducible fabrication process.

It will be apparent to those skilled in the art that various modifications and variations can be made in the semiconductor device and method for fabricating the same of the present invention without departing from the spirit or scope of the invention. Thus, it is intended that the present invention cover the modifications and variations of this invention provided they come within the scope of the appended claims and their equivalents.

What is claimed is:

1. A semiconductor device comprising:
   a semiconductor substrate having a gate trench therein, the gate trench having a first portion with a rectangular cross-section, and a second portion, formed beneath the first portion, having an elliptical cross-section and a width greater than a width of the first portion, the width of said elliptical cross-section being greater than the combined height of said first and second portions;
   a gate oxide layer formed on an interior surface of said gate trench;
   a gate electrode formed in said gate trench having said gate oxide layer formed on said interior surface thereof; and
   source and drain regions formed in said semiconductor substrate adjacent to said gate trench.

2. The device according to claim 1, wherein said source region is formed at a first depth and said drain region is formed at a second depth in said semiconductor substrate, the first depth being deeper than the second depth.

3. The device according to claim 1, wherein said gate trench overlaps said source and drain regions.

4. The device according to claim 1, wherein said second portion overlaps said source and drain regions.

5. The device according to claim 1, comprising an insulating layer formed over said semiconductor substrate including said gate trench having said gate electrode formed therein.

6. The device according to claim 1, wherein said semiconductor substrate includes an active region, said gate trench having said gate electrode formed therein being provided in said active region.

7. The device according to claim 1, wherein said active region is defined by a device isolation layer.

8. A method for fabricating a semiconductor device, comprising:
   forming a gate trench in a semiconductor substrate, the gate trench having a first portion with a rectangular cross section, and a second portion, beneath the first portion, having an elliptical cross-section and a width greater than a width of the first portion, the width of said elliptical cross-section being greater than the combined height of said first and second portions;
   forming a gate oxide film on an interior surface of the gate trench;
   forming a gate electrode in the gate trench; and
   forming source and drain regions in the semiconductor substrate adjacent to said gate electrode.

9. The method according to claim 8, wherein forming the first portion comprises dry etching the semiconductor substrate.

10. The method according to claim 8, wherein forming the second portion comprises wet etching the semiconductor substrate.

11. The method according to claim 9, wherein forming the second gate trench comprises wet etching the semiconductor substrate.

12. The method according to claim 8, wherein forming the gate oxide film comprises thermally oxidizing an interior surface of the gate trench.

13. The method according to claim 8, wherein forming the gate electrode comprises depositing polysilicon in the gate trench having the gate oxide film formed therein.

14. The method according to claim 8, wherein forming the source region comprising doping a first region of the semiconductor substrate at first depth and forming the drain region comprises doping a second region of the semiconductor substrate at a second depth, the first depth being deeper than the second depth.

15. The method according to claim 14, the first region is more lightly doped than the second region.

16. The method according to claim 8, further comprising forming a device isolation layer in the semiconductor substrate to define an active region thereon, such that the gate trench having the gate oxide film formed therein and the gate electrode formed in the gate trench are formed in the active region.

17. The method according to claim 8, wherein forming the first portion comprises:
   forming an etch mask pattern on the semiconductor substrate so as to leave a portion of the semiconductor substrate exposed;
   using the etch mask pattern an etch mask to etch the exposed portion of the semiconductor substrate to form the first portion.

18. The method according to claim 17, wherein forming the etch mask pattern on the semiconductor substrate comprises:
   forming a buffer oxide film on the semiconductor substrate;
   forming a nitride layer on the buffer oxide film; and
   patterning the nitride layer and buffer oxide film to form the etch mask pattern on the semiconductor substrate.

19. The method according to claim 17, comprising dry etching the exposed portion of the semiconductor substrate using the etch mask.

20. The method according to claim 16, wherein forming the device isolation layer comprises:
   forming an etch mask pattern on the semiconductor substrate so as to leave a region of the semiconductor substrate corresponding to the device isolation layer exposed;
   etching the exposed region of the semiconductor substrate to form a trench; and
   depositing an insulating material layer in the trench.

21. The method according to claim 20, wherein forming the etch mask pattern comprises:
   forming a pad oxide film on the semiconductor substrate;
   forming a nitride layer on the pad oxide film;
   forming a photoresist pattern on the nitride layer so as to mask a region of the nitride layer corresponding to the active region of the semiconductor substrate and leave a portion of the nitride layer exposed; and
   etching the nitride layer and the pad oxide layer to form the etch mask pattern comprising a pattern of nitride layer portions stacked on a corresponding pattern of pad oxide film portions.

* * * * *